US012486598B2

(12) United States Patent
Jiang et al.

(10) Patent No.: US 12,486,598 B2
(45) Date of Patent: Dec. 2, 2025

(54) ROCKING TYPE SEED CRYSTAL SURFACE CORROSION, CLEANING AND DRYING DEVICE AND PROCESS METHOD

(71) Applicant: THE 13TH RESEARCH INSTITUTE OF CHINA ELECTRONICS TECHNOLOGY GROUP CORPORATION, Hebei (CN)

(72) Inventors: Jian Jiang, Hebei (CN); Niefeng Sun, Hebei (CN); Tongnian Sun, Hebei (CN); Shujie Wang, Hebei (CN); Huimin Shao, Hebei (CN); Lijie Fu, Hebei (CN); Yanlei Shi, Hebei (CN); Xiaolan Li, Hebei (CN)

(73) Assignee: THE 13TH RESEARCH INSTITUTE OF CHINA ELECTRONICS TECHNOLOGY GROUP CORPORATION, Shijiazhuang (CN)

( * ) Notice: Subject to any disclaimer, the term of this patent is extended or adjusted under 35 U.S.C. 154(b) by 376 days.

(21) Appl. No.: 17/880,597

(22) Filed: Aug. 3, 2022

(65) Prior Publication Data

US 2023/0038976 A1 Feb. 9, 2023

Related U.S. Application Data

(63) Continuation of application No. PCT/CN2021/090859, filed on Apr. 29, 2021.

(51) Int. Cl.
*C30B 35/00* (2006.01)
*C30B 29/40* (2006.01)
*C30B 33/10* (2006.01)

(52) U.S. Cl.
CPC ............ *C30B 35/007* (2013.01); *C30B 29/40* (2013.01); *C30B 33/10* (2013.01); *C30B 35/00* (2013.01)

(58) Field of Classification Search
CPC ........... B08B 3/04; B08B 3/044; B08B 3/045; B08B 3/047; B08B 3/048; B08B 3/08;
(Continued)

(56) References Cited

FOREIGN PATENT DOCUMENTS

CN 204724523 10/2015
CN 206064921 4/2017
(Continued)

OTHER PUBLICATIONS

Machine Translation of Heo, KR-101828248-B1, Feb. 2018. (Year: 2018).*
(Continued)

*Primary Examiner* — David G Cormier
(74) *Attorney, Agent, or Firm* — Enable IP, P.C.

(57) ABSTRACT

A rocking type seed crystal surface corrosion, cleaning and drying device and a process method belong to the technical field of semiconductor crystal growth, comprising a corrosion tank and a matched corrosion tank cover, a seed crystal support platform arranged at a middle position of the bottom of the corrosion tank, and a high-purity hot nitrogen introduction short straight pipe, an corrosive liquid introduction short straight pipe, a deionized water introduction short straight pipe and an overflow liquid discharge short straight pipe matched with and arranged at both sides of the corrosion tank, wherein free ends of the high-purity hot nitrogen introduction short straight pipe, the corrosive liquid introduction short straight pipe and the deionized water introduction short straight pipe are all provided with switch stop valves; the device further comprises a rocking mechanism provided at the bottom of the corrosion tank; and the seed crystal support platform comprises a support frame symmetrically distributed on both sides of the vertical central axis of the corrosion tank and positioned at the bottom of the corrosion tank, a seed crystal support wheel mounted on an
(Continued)

upper end of the support frame via a rotating shaft, and a matched seed crystal support wheel limiting mechanism. Adequate corrosion can be performed on the entire seed crystal surface, and the cleaning and drying processes of the seed crystal in the subsequent process can be combined organically to avoid secondary contamination of the seed crystal in the subsequent process.

9 Claims, 6 Drawing Sheets

(58) Field of Classification Search
CPC ......... B08B 9/023; B08B 11/02; C30B 29/40; C30B 33/10; C30B 35/00; C30B 35/007
See application file for complete search history.

(56) References Cited

FOREIGN PATENT DOCUMENTS

| | | | | |
|---|---|---|---|---|
| CN | 209260259 | | | 8/2019 |
| CN | 111733458 | A | | 10/2020 |
| JP | 199971694 | | | 6/1999 |
| KR | 101828248 | B1 | * | 2/2018 |

OTHER PUBLICATIONS

The International Search Report for PCT application PCT/CN2021/090859 filed on Apr. 29, 2021 dated Mar. 2, 2022.

* cited by examiner

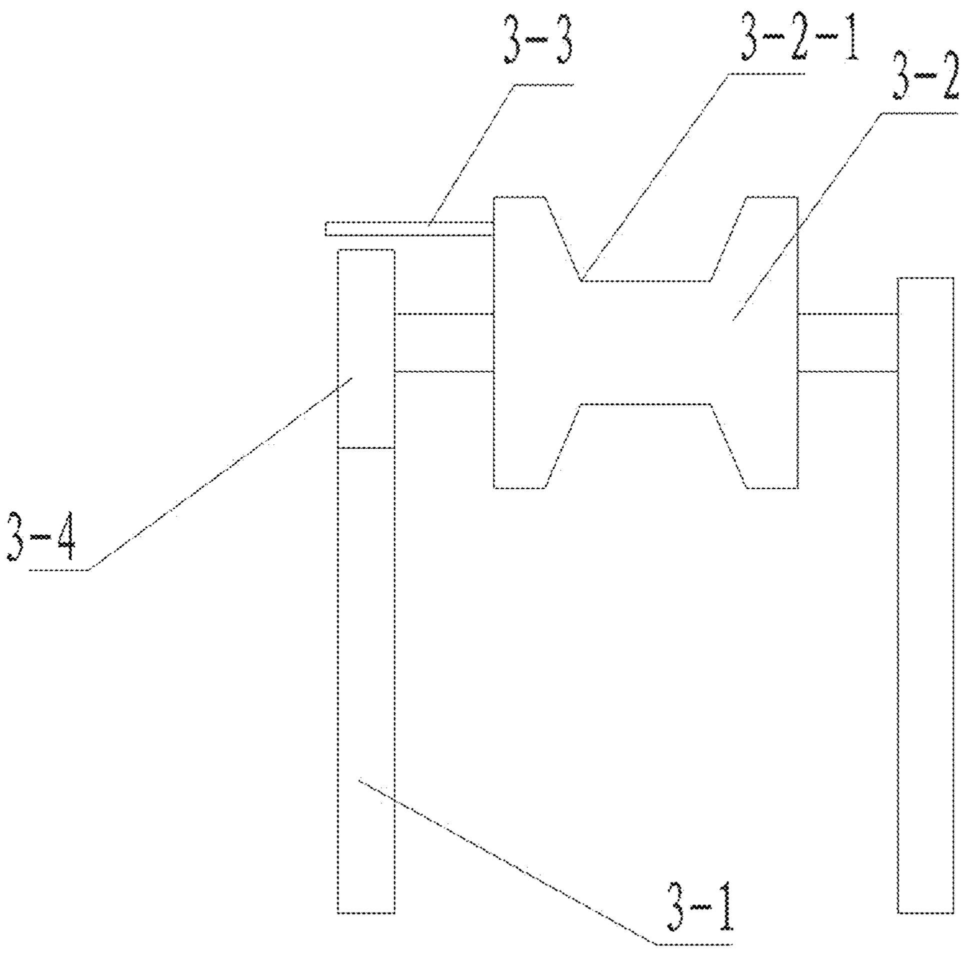
Fig. 3
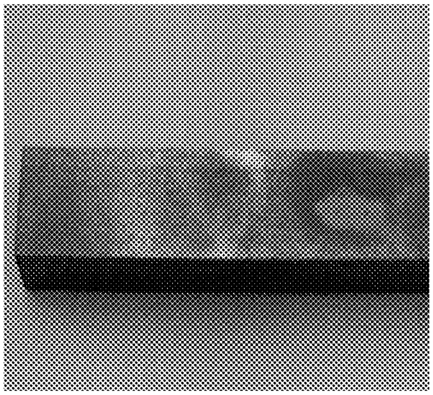
Fig. 4a Side surface macro morphologies of the sample A

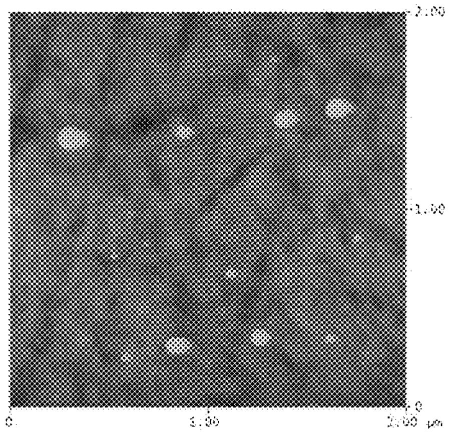
Fig. 4b Side surface AFM figure of the sample A
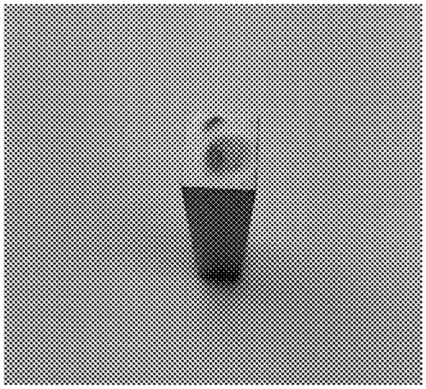
Fig. 5a End surface macro morphologies of the sample B
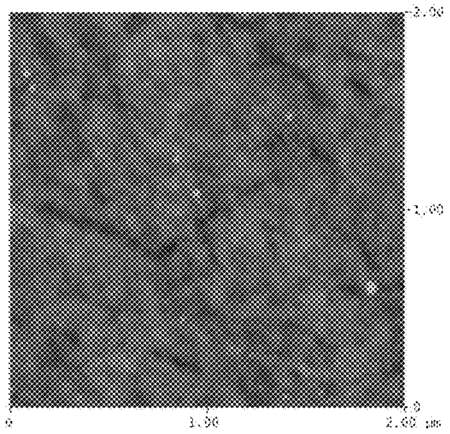
Fig. 5b End surface AFM figure of the sample B

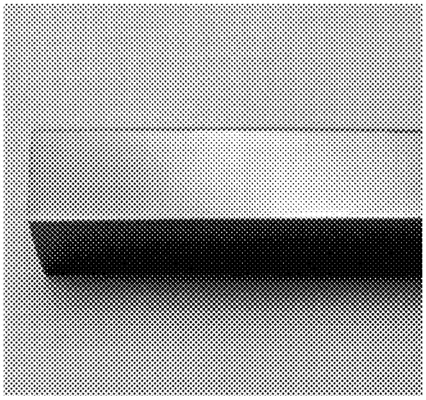
Fig.6a Side surface macro morphologies of the sample C
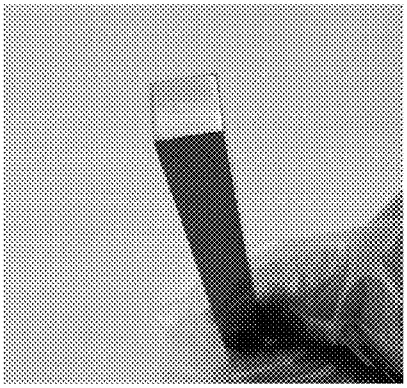
Fig. 6b End surface macro morphologies of the sample C
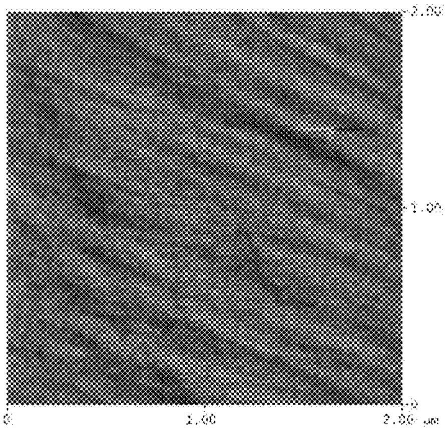
Fig.6c Side surface AFM figure of the sample C

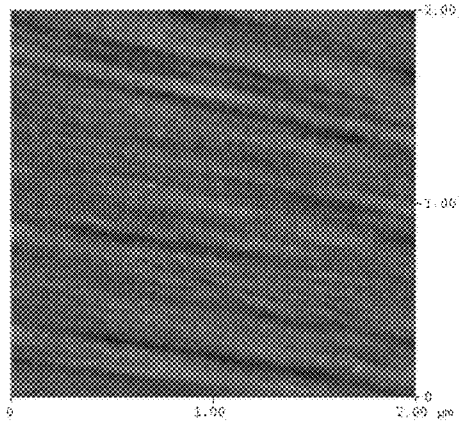
Fig. 6d End surface AFM figure of the sample C

ROCKING TYPE SEED CRYSTAL SURFACE CORROSION, CLEANING AND DRYING DEVICE AND PROCESS METHOD

CROSS REFERENCE TO RELATED APPLICATION

This application is a continuation of PCT Application No. PCT/CN2021/090859, filed on Apr. 29, 2021, which claims priority to Chinese Patent Application No. 202010751355.X, filed on Jul. 30, 2020, and each application is hereby incorporated by reference in its entirety.

TECHNICAL FIELD

The present invention belongs to the technical field of semiconductor crystal growth, and particularly relates to a seed crystal surface corrosion, cleaning and drying device and a process method in a crystal growth process.

BACKGROUND ART

Semiconductor devices, such as chips, high-frequency modules, large-scale integrated circuits and super-large scale integrated circuits, all require high-quality single crystals as their production materials. At the beginning of most crystal growth processes, the molten crystal needs to be seeded and grown by means of a seed crystal. It can be that the crystal growth process cannot be carried out without the seed crystal. The purity and cleanliness of the seed crystal surface have a direct impact on the crystal quality during the crystal growth. In the conventional seed crystal corrosion process, the seed crystal is immersed in the corrosive liquid held by the vessel, a part of the surface of the seed crystal is in contact with the wall or bottom of the vessel, and the phenomenon that the corrosion rate of the surface of the seed crystal at the mutual contact surface thereof is low, the overall reaction is uneven, and the cleaning of impurities on the surface is incomplete often occurs. Such incompletely cleaned seed crystals, when in contact with the crystal melt, introduce new impurities into the melt, reduce crystal parameters, generate crystal defects, and affect the overall crystal growth quality.

SUMMARY OF THE INVENTION

The technical problem to be solved by the present invention is to provide a rocking type seed crystal surface corrosion, cleaning and drying device and a process method, which can sufficiently corrode the entire seed crystal surface, and enable the cleaning and drying process of the seed crystal in the subsequent process to be organically and uniformly combined. It can avoid the secondary pollution generated to the seed crystal during the subsequent process operation, effectively guarantee the purity and cleanliness of the seed crystal on the unused front surface, reduce the number of process steps and the operating cost, improve the working efficiency, and can greatly improve the crystal quality and crystal yield during crystal growth.

The invention adopts the following technical solution. A rocking type seed crystal surface corrosion, cleaning and drying device includes a corrosion tank and a matched corrosion tank cover, a seed crystal support platform arranged at a middle position of the bottom of the corrosion tank, and a high-purity hot nitrogen introduction short straight pipe, an corrosive liquid introduction short straight pipe, a deionized water introduction short straight pipe and an overflow liquid discharge short straight pipe matched with and arranged at both sides of the corrosion tank, wherein free ends of the high-purity hot nitrogen introduction short straight pipe, the corrosive liquid introduction short straight pipe and the deionized water introduction short straight pipe are all provided with switch stop valves; the device further comprises a rocking mechanism provided at the bottom of the corrosion tank; and the seed crystal support platform comprises a support frame symmetrically distributed on both sides of the vertical central axis of the corrosion tank and positioned at the bottom of the corrosion tank, a seed crystal support wheel mounted on an upper end of the support frame via a rotating shaft, and a matched seed crystal support wheel limiting mechanism.

Further, an annular groove is provided on the seed crystal support wheel, and the cross section of the annular groove is in the shape of an isosceles trapezoid.

Further, the seed crystal support wheel limiting mechanism comprises a limiting rod arranged at one side of the seed crystal support wheel and a limiting plate symmetrically arranged at both sides of the support frame; and the limiting angle of the seed crystal support wheel limiting mechanism is formed by rotating leftward and rightward for 45-60° based on the vertical axis of the support frame.

Further, the rocking mechanism comprises a base, a rocking rotating shaft provided on the base via a support rod, a rocking platform hinged on the rocking rotating shaft, and a matched rocking driving mechanism; wherein the upper end face of the rocking platform is connected to the bottom face of the corrosion tank.

Further, the rocking driving mechanism comprises a rocking motor provided on the base, a rocking runner provided at an output end of the rocking motor, and a rocking rod hinged to a lower end face of the rocking runner and the rocking platform.

Furthermore, the rocking mechanism further comprises a surrounding plate arranged around the base, and a telescopic protective curtain connected to an upper end face of the surrounding plate and a lower end face of the rocking platform, wherein the material of the telescopic protective curtain is silica gel or fluorelastomer.

Further, the high-purity hot nitrogen gas introduction short straight pipe and the deionized water introduction short straight pipe are distributed in an up-and-down position and are mounted on one side of the corrosion tank; the overflow liquid discharge short straight pipe and the corrosive liquid introduction short straight pipe are distributed in an up-and-down position and are mounted on the other side of the corrosion tank; the high-purity hot nitrogen gas introduction short straight pipe is tilted upwards, and has an included angle of 30-40° with the wall of the corrosion tank; the deionized water introduction short straight pipe and the corrosive liquid introduction short straight pipe are tilted upwards, and has an included angle of 50-60° with the wall of the corrosion tank; and the overflow liquid discharge short straight pipe is tilted downwards, and has an included angle of 50-60° with the wall of the corrosion tank.

Further, a drain pipe and a matched switch stop valve are provided at the bottom of the corrosion tank, and the inner wall of the corrosion tank is provided with a level scale of the inflow corrosive liquid.

An anti-collision buffer pad is mounted inside the corrosion tank on both sides and at the same horizontal position as the seed crystal support wheel.

A process method based on the rocking type seed crystal surface corrosion, cleaning and drying device is provided, and the process method comprises the steps of:

1) opening a corrosion tank cover, placing a seed crystal on an appropriate position of a seed crystal support wheel via a special fixture, and covering it by the corrosion tank cover;
2) opening a switch stop valve of a corrosive liquid introduction short straight pipe, so that the corrosive liquid flows into the corrosion tank at a flow rate of 0.35 L/min; and the switch stop valve of the corrosive liquid introduction short straight pipe is closed when the liquid level of the corrosive liquid smoothly rises to a suitable level scale; starting a rocking mechanism, and performing corrosion on the seed crystal at a rocking amplitude of 10°-20° and a rocking speed of 1°/S–2°/S; after corroding for 2-5 min, closing the rocking motor; after the rocking platform returns to an initial horizontal position, opening the switch stop valve of the drain pipe, so that the corrosive liquid is slowly discharged at a flow rate of 0.5 L/min; and after all the liquid is discharged, closing the switch stop valve of the drain pipe;
3) opening a switch stop valve of a deionized water introduction short straight pipe, so that the deionized water flows into the corrosion tank at a flow rate of 0.4 L/min; when the liquid level of the deionized water smoothly rises to the overflow liquid discharge short straight pipe and begins to overflow, starting the rocking motor, and performing overflow cleaning on the seed crystal at a rocking amplitude of 10°-20° and a rocking speed of 1°/S–2°/S; after cleaning for 10-20 min, closing the switch stop valve of the rocking motor and the deionized water introduction short straight pipe; opening the switch stop valve of the drain pipe, so that the deionized water is slowly discharged at a flow rate of 0.5 L/min; after all the liquid is discharged, closing the switch stop valve of the drain pipe;
4) opening a switch stop valve of a high-purity hot nitrogen gas introduction short straight pipe, so that the high-purity hot nitrogen gas passes into the corrosion tank at a flow rate of 2-3 L/min, and purging and drying the seed crystal; at the same time, turning on the rocking motor, rocking the seed crystal at a rocking amplitude of 10°-20° and a rocking speed of 1°/S–2°/S; and after 10-15 min, turning off the switch stop valve of the high-purity hot nitrogen gas introduction short straight pipe and the rocking motor to complete the operation.

Advantageous Effects with the Invention: compared with the conventional static seed treatment method, the dynamic seed treatment process of the present invention can sufficiently corrode the entire seed crystal surface, and enable the cleaning and drying process of the seed crystal in the subsequent process to be organically and uniformly combined, so that the treatment effect is more thorough. It can avoid the secondary pollution generated to the seed crystal during the subsequent process operation, effectively guarantee the purity and cleanliness of the seed crystal on the unused front surface, reduce the number of process steps and the operating cost, and improve the working efficiency. In addition, the crystal quality and crystal yield can be greatly improved.

BRIEF DESCRIPTION OF THE DRAWINGS

FIG. 3 is a schematic view of a seed crystal support wheel limiting mechanism.

FIG. **4*a*** is the Side surface macro morphologies of the sample A.

FIG. **4*b*** is the Side surface AFM figure of the sample A.

FIG. **5*a*** is the End surface macro morphologies of the sample B.

FIG. **5*b*** is the End surface AFM figure of the sample B.

FIG. **6*a*** is the Side surface macro morphologies of the sample C.

FIG. **6*b*** is the Side surface macro morphologies of the sample C.

FIG. **6*c*** is the Side surface macro morphologies of the sample C.

FIG. **6*d*** is the Side surface macro morphologies of the sample C.

DETAILED DESCRIPTION OF THE INVENTION

Figure 1:
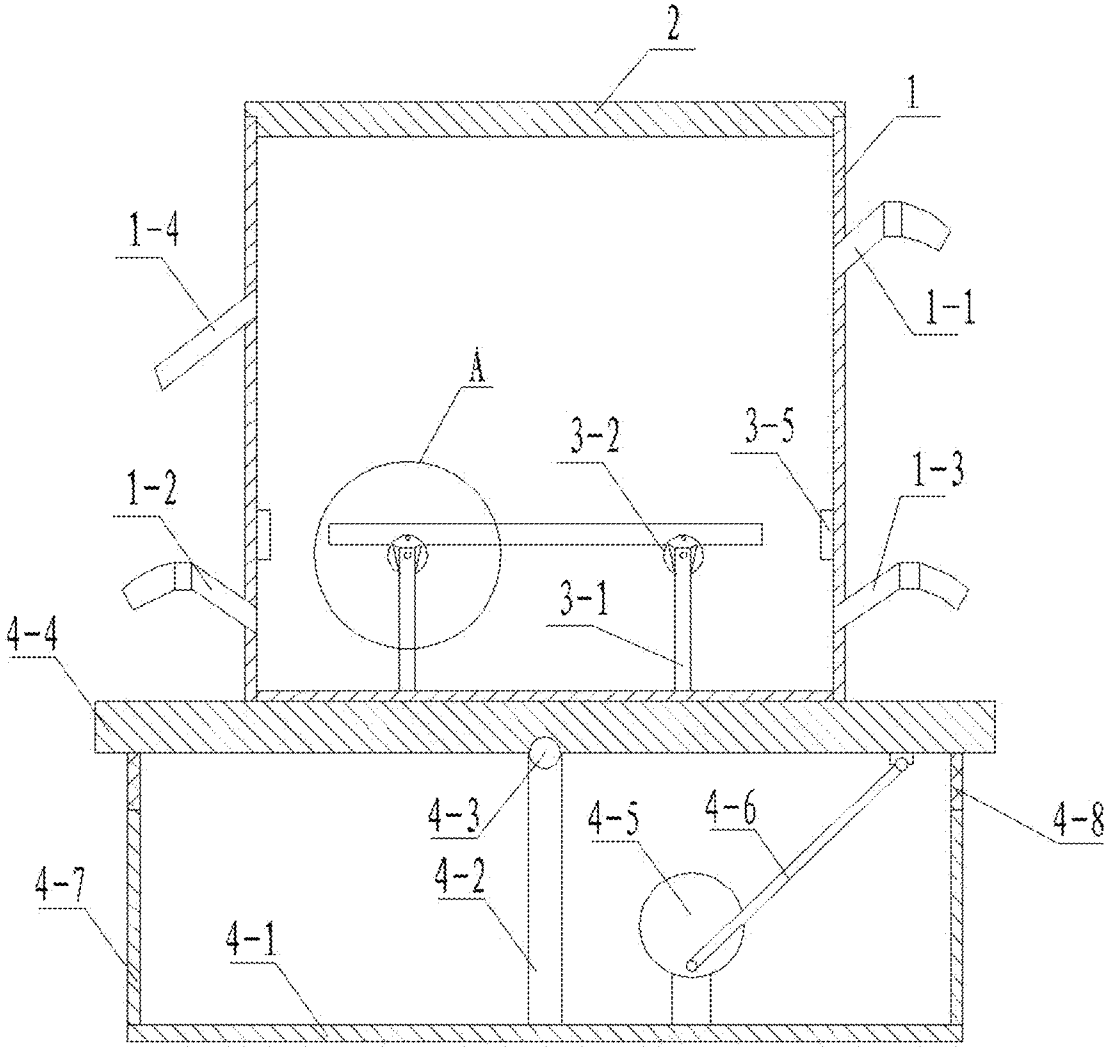
FIG. 1 is a structurally schematic view of the present invention.
Figure 2:
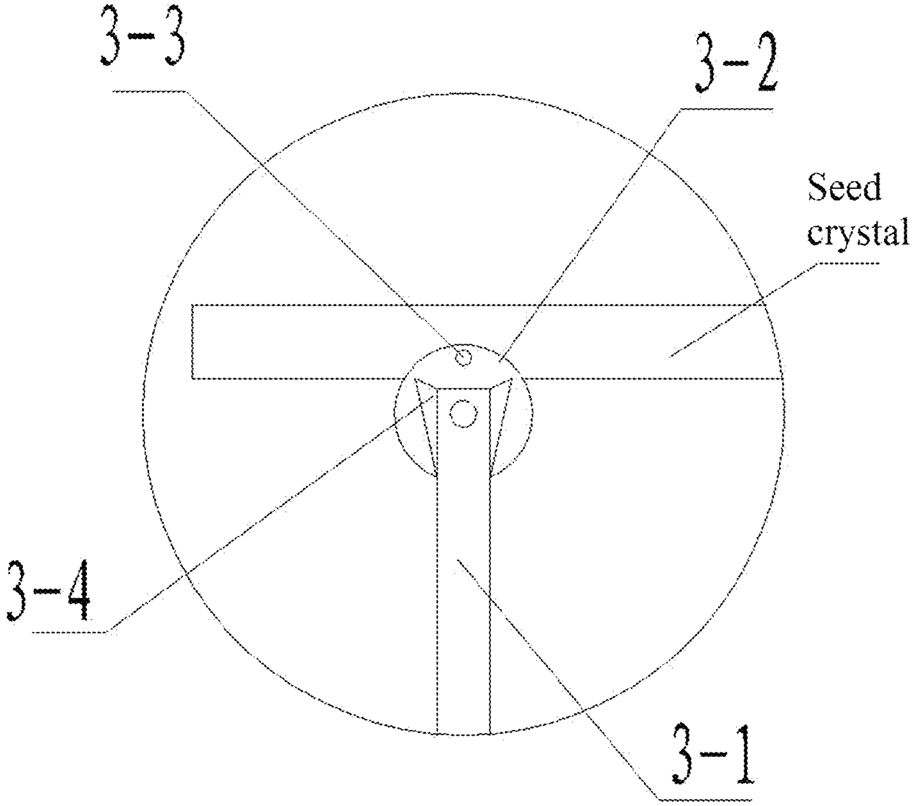
FIG. 2 is an enlarged schematic view of A in FIG. 1.

With reference to FIGS. 1-3, A rocking type seed crystal surface corrosion, cleaning and drying device includes a corrosion tank 1 and a matched corrosion tank cover 2, a seed crystal support platform arranged at a middle position of the bottom of the corrosion tank 1, and a high-purity hot nitrogen introduction short straight pipe 1-1, an corrosive liquid introduction short straight pipe 1-2, a deionized water introduction short straight pipe 1-3 and an overflow liquid discharge short straight pipe 1-4 matched with and arranged at both sides of the corrosion tank 1, wherein free ends of the high-purity hot nitrogen introduction short straight pipe 1-1, the corrosive liquid introduction short straight pipe 1-2 and the deionized water introduction short straight pipe 1-3 are all provided with switch stop valves, characterized in that the device further comprises a rocking mechanism provided at the bottom of the corrosion tank 1; and the seed crystal support platform includes a support frame 3-1 symmetrically distributed on both sides of the vertical central axis of the corrosion tank 1 and positioned at the bottom of the corrosion tank 1, a seed crystal support wheel 3-2 mounted on an upper end of the support frame 3-1 via a rotating shaft, and a matched seed crystal support wheel limiting mechanism. The corrosion tank 1, the corrosion tank cover 2, the high-purity hot nitrogen gas introduction short straight pipe 1-1, the corrosive liquid introduction short straight pipe 1-2, the deionized water introduction short straight pipe 1-3, and the overflow liquid discharge short straight pipe 1-4 are made of high-purity quartz or other high-purity corrosion-resistant and temperature-resistant materials. The switch stop valves of the high-purity hot nitrogen gas introduction short straight pipe 1-1, the corrosive liquid introduction short straight pipe 1-2 and the deionized water introduction short straight pipe 1-3 are all corrosion-resistant and temperature-resistant switch stop valves, which can be operated manually or electrically to control the quantity of flow and flow rate, and the hoses correspondingly connected thereto are also all corrosion-resistant and temperature-resistant hoses.

An annular groove 3-2-1 is provided on the seed crystal support wheel 3-2, and the cross section of the annular groove 3-2-1 is in the shape of an isosceles trapezoid. The seed crystal support wheel limiting mechanism includes a limiting rod 3-3 arranged at one side of the seed crystal support wheel 3-2 and a limiting plate 3-4 symmetrically arranged at both sides of the support frame 3-1; and the limiting angle of the seed crystal support wheel limiting mechanism is formed by rotating leftward and rightward for 45-60° based on the vertical axis of the support frame 3-1. The material of the seed crystal support wheel 3-2 is a material which is corrosion-resistant and temperature-resistant such as fluorelastomer or silica gel and has a greater friction coefficient with the contact surface (inner concave surface) of the seed crystal edge, a limiting rod 3-3 is provided on one side of the seed crystal support wheel 3-2, and the limiting rod 3-3 is Teflon or other corrosion-resistant and temperature-resistant materials. When the rocking platform 4-4 needs to be adjusted to a maximum process rocking amplitude and a fastest process rocking speed in the process of processing the seed crystal, a sufficient friction force can be generated on the contact surface between the annular groove 3-2-1 of the seed crystal support wheel 3-2 and the seed crystal edge. When the limiting rod 3-3 touches the limiting plate 3-4 to stop the rotation of the seed crystal support wheel 3-2, the sliding force of the inertia generated by the seed crystal is less than the static friction force generated by the contact surface of the seed crystal edge and the inner concave surface of the clamping wheel, and the seed crystal does not generate relative sliding with the stopped seed crystal support wheel 3-2. That is, when the seed crystal support wheel 3-2 stops rotating, the seed crystal also stops relative movement.

When the seed crystal is put into the appropriate position of the seed crystal support wheel 3-2, and the seed crystal support wheel 3-2 stops in the forward and reverse rotation during the rocking process, the seed crystal and the seed crystal support wheel 3-2 will generate a relative maximum displacement. Even when the relative maximum displacement is generated, the end face of the seed crystal will not collide with the corresponding anti-collision buffer pad 3-5, and both of them are kept at a certain distance from the anti-collision buffer pad 3-5.

The support frame 3-1, the rotating shaft and the limiting plate 3-4 are all other corrosion-resistant and temperature-resistant materials such as quartz and ceramic.

The rocking mechanism includes a base 4-1, a rocking rotating shaft 4-3 provided on the base 4-1 via a support rod 4-2, a rocking platform 4-4 hinged on the rocking rotating shaft 4-3 and a matched rocking driving mechanism; and the upper end face of the rocking platform 4-4 is connected to the bottom face of the corrosion tank 1. The rocking platform 4-4 is a corrosion-resistant, flat and non-deformable abutment made of materials such as quartz and ceramic.

The rocking driving mechanism includes a rocking motor provided on the base 4-1, a rocking runner 4-5 provided at an output end of the rocking motor, and a rocking rod 4-6 hinged to a lower end surface of the rocking runner 4-5 and the rocking platform 4-4.

The rocking mechanism further includes a surrounding plate 4-7 arranged around the base 4-1, and a telescopic protective curtain 4-8 connected to an upper end face of the surrounding plate 4-7 and a lower end face of the rocking platform 4-4, wherein the material of the telescopic protective curtain 4-8 is silica gel or fluorelastomer, and the telescopic movement can be performed according to the rocking of the rocking platform 4-4, and the sealing performance is good. The high-purity hot nitrogen introduction short straight pipe 1-1 and deionized water introduction short straight pipe 1-3 are distributed in an up-and-down position and are mounted on one side of the corrosion tank 1; the overflow liquid discharge short straight pipe 1-4 and the corrosive liquid introduction short straight pipe 1-2 are distributed in an up-and-down position and are mounted on the other side of the corrosion tank 1; the high-purity hot nitrogen introduction short straight pipe 1-1 is tilted upwards, and has an included angle of 30-40° with the wall of the corrosion tank 1; the deionized water introduction short straight pipe 1-3 and the corrosive liquid introduction short straight pipe 1-2 are tilted upwards, and has an included angle of 50-60° with the wall of the corrosion tank 1; and the overflow liquid discharge short straight pipe 1-4 is tilted downwards, and has an included angle of 50-60° with the wall of the corrosion tank 1.

The high-purity hot nitrogen introduction short straight pipe 1-1 is tilted upwards, and has an included angle of 30-40° with the wall of the corrosion tank 1, so that the high-purity hot nitrogen is blown to the seed crystal, drying same as soon as possible, and driving the water vapor around the seed crystal and in the tank, so that the water vapor is discharged through the overflow liquid discharge short straight pipe 1-4. The high-purity hot nitrogen gas introduction short straight pipe 1-1 is set at a certain suitable height, with the purpose of not being contaminated by the liquid thereof during the process of corrosion and cleaning the seed crystal, so as to prevent the high-purity hot nitrogen blown out with impurities adhered to the liquid from contaminating the surface of the seed crystal again. The switch stop valve of the high-purity hot nitrogen gas introduction short straight pipe 1-1 is only opened when the high-purity hot nitrogen gas is introduced, which is normally in a locked state.

The corrosive liquid introduction short straight pipe 1-2 is arranged at a lower part of the corrosion tank 1, so that the corrosive liquid rises from the lower part of the seed crystal to a suitable level scale at a relatively slow speed. When the corrosive liquid is injected above the corrosion tank 1, the seed crystal is washed down due to the impact on the seed crystal, and a part of the irruptive corrosive liquid splashes and is adhered to the high-purity hot nitrogen gas introduction short straight pipe 1-1, so that the high-purity hot nitrogen gas blown out is contaminated. The corrosive liquid introduction short straight pipe 1-2 is tilted upwards, and has an included angle of 50-60° with the wall of the corrosion tank 1, so that after the seed crystal is washed out by the deionized water and the deionized water is discharged through the drainage pipe, no residual deionized water exists at the interface of the corrosive liquid introduction short straight pipe 1-2 1-2 and the corrosion tank 1. In the next step of hot nitrogen drying process, flowing hot nitrogen will be prevented from bringing in the water vapor of residual deionized water at the interface, affecting the drying effect and reducing the working efficiency. The switch stop valve of the corrosive liquid introduction short straight pipe 1-2 is only opened when the corrosive liquid is introduced, which is normally in a locked state.

The deionized water introduction short straight pipe 1-3 is arranged at a lower part of the corrosion tank 1, with the purpose of enabling the deionized water to rise to a suitable liquid level scale at a relatively slow speed from the lower part of the seed crystal, so as to prevent the seed crystal from being washed down due to impact when the deionized water is injected above the corrosion tank 1, and a part of the irruptive deionized water splashing and adhering to the high-purity hot nitrogen introduction short straight pipe 1-1. The deionized water introduction short straight pipe 1-3 is tilted upwards, and has an included angle of 50-60° with the wall of the corrosion tank 1, so that after the seed crystal is washed by the deionized water, and the deionized water is discharged through the flow discharge port, there is no residual deionized water at the interface of the deionized water introduction short straight pipe 1-3 and the corrosion tank 1. In the next step of hot nitrogen drying process, flowing hot nitrogen will be prevented from bringing in the water vapor of residual deionized water at the interface, affecting the drying effect and reducing the working efficiency. The switch stop valve of the deionized water introduction short straight pipe 1-3 is only opened when the deionized water is introduced, which is normally in a locked state.

The overflow liquid discharge short straight pipe 1-4 is at a suitable height above the corrosion tank 1, with the suitable height meaning that when the liquid is at a suitable level scale, the rocking platform 4-4 needs to be adjusted to the maximum process rocking amplitude and the fastest process rocking speed. Due to the inertia caused by the rocking on the corrosive liquid, the corrosive liquid will not flow to the interface between the overflow liquid discharge short straight pipe 1-4 and the corrosion tank 1, i.e. the corrosive liquid will not gradually run off due to the rocking, which enables the surface of the seed crystal to be exposed out of the surface of the corrosive liquid during the rocking process and causes the phenomenon of inconsistent corrosion rate or uneven corrosion to occur. The overflow liquid discharge short straight pipe 1-4 is tilted downwards, and has an included angle of 50-60° with the wall of the corrosion tank 1, so that the overflow liquid drains quickly when the deionized water used for cleaning the seed crystal rises up to the interface of the overflow liquid discharge short straight pipe 1-4 and the corrosion tank 1, without backflow of the overflow liquid. Therefore, the cleaning is more thorough and the cleaning efficiency is improved.

A drain pipe and a matched switch stop valve are provided at the bottom of the corrosion tank 1, and the inner wall of the corrosion tank 1 is provided with a level scale of the inflow corrosive liquid.

An anti-collision buffer pad 3-5 is mounted inside the corrosion tank 1 at both sides and at the same horizontal position as the seed crystal support wheel 3-2. The anti-collision buffer pad 3-5 is a corrosion-resistant and temperature-resistant material such as fluorelastomer or Teflon. It prevents the limiting rod 3-3 at one side of the seed crystal support wheel 3-2 from being accidentally broken due to aging, causing the rotation of the seed crystal support wheel 3-2 to be out of control, or the rocking amplitude and rocking speed caused to be abnormal due to the failure of the rocking motor, or other factors causing the end face of the seed crystal to collide against the wall of the corrosion tank 1, resulting in the damage to the seed crystal or the wall of the corrosion tank 1.

A process method based on the rocking type seed crystal surface corrosion, cleaning and drying device is provided, and the process method includes the steps of:

1) opening a corrosion tank cover 2, placing a seed crystal on an appropriate position of a seed crystal support wheel 3-2 via a special fixture, and covering it by the corrosion tank cover 2;
2) opening a switch stop valve of a corrosive liquid introduction short straight pipe 1-2, so that the corrosive liquid flows into the corrosion tank 1 at a flow rate of 0.35 L/min; and the switch stop valve of the corrosive liquid introduction short straight pipe 1-2 is closed when the liquid level of the corrosive liquid smoothly rises to a suitable level scale; starting a rocking mechanism, and performing corrosion on the seed crystal at a rocking amplitude of 10°-20° and a rocking speed of 1°/S–2°/S; after corroding for 2-5 min, closing the rocking motor; after the rocking platform 4-1 returns to an initial horizontal position, opening the switch stop valve of the drain pipe, so that the corrosive liquid is slowly discharged at a flow rate of 0.5 L/min; and after all the liquid is discharged, closing the switch stop valve of the drain pipe;
3) opening a switch stop valve of a deionized water introduction short straight pipe 1-3, so that the deionized water flows into the corrosion tank 1 at a flow rate of 0.4 L/min; when the liquid level of the deionized water smoothly rises to the overflow liquid discharge short straight pipe 1-4 and begins to overflow, starting the rocking motor, and performing overflow cleaning on the seed crystal at a rocking amplitude of 10°-20° and a rocking speed of 1°/S–2°/S; after cleaning for 10-20 min, closing the switch stop valve of the rocking motor and the deionized water introduction short straight pipe 1-3; opening the switch stop valve of the drain pipe, so that the deionized water is slowly discharged at a flow rate of 0.5 L/min; after all the liquid is discharged, closing the switch stop valve of the drain pipe;
4) opening a switch stop valve of a high-purity hot nitrogen gas introduction short straight pipe 1-1, so that the high-purity hot nitrogen gas passes into the corrosion tank 1 at a flow rate of 2-3 L/min, and purging and drying the seed crystal; at the same time, turning on the rocking motor, rocking the seed crystal at a rocking amplitude of 10°-20° and a rocking speed of 1°/S–2°/S; and after 10-15 min, turning off the switch stop valve of the high-purity hot nitrogen gas introduction short straight pipe 1-1 and the rocking motor to complete the operation.

According to the technical effects produced by the above-mentioned method, during the relative movement between the seed crystal and the seed crystal support wheel 3-2, the contact surface between the edge of the seed crystal and the seed crystal support wheel 3-2 changes at any time, and all the contact surfaces of the seed crystal are treated by corresponding processes, namely, all the surfaces of the seed crystal can be treated by processes of corrosion, cleaning and drying. In conventional static corrosion processes, there are often two conditions that lead to incomplete seed corrosion. 1, In the process of corroding the seed crystal, at least one end surface of the seed crystal always contacts the inner wall of the corrosion vessel, and the corrosive liquid is difficult to immerse in at the mutual contact surface. The corrosive liquid inside and outside the contact surface is relatively difficult to exchange with each other, and the end surface of the seed crystal at the contact surface is not sufficiently corroded. 2. During the process of corroding the seed crystal, the surface of the seed crystal will react with the corrosive liquid to generate bubbles; the bubbles generated at the lower surface of the seed crystal are sometimes trapped by the lower surface and prevented from rising to the liquid surface to adhere to the lower surface of the seed crystal. In this way, localized regions within the bubbles on the lower surface of the seed crystal are relatively slow or non-reactive, resulting in non-uniform erosion throughout and incomplete cleaning of surface impurities. By adjusting the corresponding process rocking amplitude and process rocking speed, the present invention enables each face of the seed crystal to be sufficiently eroded during the rocking process, and enables the bubbles generated on the lower surface of the seed crystal to be more smoothly freed from the barrier of the lower surface of the seed crystal and float to the liquid surface due to the inclination of the seed crystal, so as to make the reaction more uniform, sufficient and complete. Also during subsequent conventional cleaning and drying processes, the seed crystal is typically held by a dedicated seed crystal fixture and cleaned and dried under the deionized water and hot nitrogen gun. However, the clamping position of the seed crystal is relatively incompletely cleaned and dried. In the cleaning and drying process, the device of the present invention also enables each surface of the seed crystal to be sufficiently and thoroughly cleaned and dried during the rocking process by adjusting the corresponding process rocking amplitude and process rocking speed.

Experimental Results and Analysis:

The selected seed crystals of the same batch all had the length, width, and height of 100 mm*8 mm*8 mm, and were placed horizontally in a rectangular quartz vessel of 150 mm*20 mm*20 mm and placed vertically in a cylindrical quartz vessel including a bottom surface with the diameter of 15 mm and having the height of 110 mm respectively, and a sample A and a sample B were obtained by adopting two conventional static seed crystal treatment processes. A sample C was obtained by adopting the device and the dynamic treatment process.

The treatment effect of the side surface of the sample A and the treatment effect of the end surface of the sample B were shown in FIG. 4(*a*) and FIG. 5(*a*). In the corrosion process of the seed crystal, sometimes the surface of one side of the seed crystal and the end surface of the seed crystal were in too close contact with the bottom of a corrosion vessel, and thus, a corrosive liquid cannot fully react with a contact surface; and after seed crystal treatment was completed, the surface of the seed crystal had the phenomena of uneven light and dark and uneven reaction. An atomic force microscopy (AFM) was used to scan the side surface of the sample A and the end surface of the sample B, which incompletely reacted, as shown in FIG. 4(*b*) and FIG. 5(*b*), bright spots in the figures were surface impurities, and it can be seen that due to incomplete reaction, more contamination remained on the surface of the seed crystal.

The treatment effects of the sample C were shown in FIGS. 6(*a*) and (*b*), and the side surface and end surface of the seed crystal were flat, bright and consistent without uneven light and dark. The AFM was used to scan the surface of the sample C, and as shown in FIGS. 6(*c*) and (*d*), no yellow bright spots representing surface impurities and contamination were seen, which indicated that reaction on the surface of the seed crystal was sufficient and thorough.

Table 1 showed the Hall test results of the induced crystals of the different samples after crystal growth. As when the samples were tested by the AFM, part of non-test surfaces were treated, the tested seed crystal cannot directly grow, therefore, the sample D, the sample E and the sample F which were in the same batch as the sample A, the sample B and the sample C and had the same external dimensions were selected and treated by corresponding processes, the treatment process of the sample D was the same as that of the sample A, the treatment process of the sample E was the same as that of the sample B, and the treatment process of the sample F was the same as that of the sample C. By comparison, it can be found that the average mobility ratio of the induced crystals growing from the sample D and the sample E was about 4100 $cm^2/(Vs)$, and the average carrier concentration was about $7*10^{15}$ $cm^{-3}$. The mobility ratio of the induced crystals growing from the sample F is about 4600 $cm^2/(Vs)$, and the carrier concentration was about $4*10^{15}$ $cm^3$. The Hall parameters of the induced crystals growing from the sample F were superior to those of the induced crystals growing from the samples D and E.

TABLE 1

Hall test results of the induced crystals of samples D, E and F after crystal growth

| Position apart from the top of the crystal/mm | Mobility ratio/($cm^2 \cdot V^{-1} \cdot s^{-1}$) | Carrier concentration/$cm^{-3}$ |
|---|---|---|
| 5 | 4163 (D) | $7.326 \times 10^{15}$ (D) |
| | 4250 (E) | $7.115 \times 10^{15}$ (E) |
| | 4633 (F) | $4.604 \times 10^{15}$ (F) |
| 10 | 4102 (D) | $7.754 \times 10^{15}$ (D) |
| | 4184 (E) | $7.685 \times 10^{15}$ (E) |
| | 4604 (F) | $4.858 \times 10^{15}$ (F) |
| 15 | 4080 (D) | $8.026 \times 10^{15}$ (D) |
| | 4127 (E) | $7.925 \times 10^{16}$ (E) |
| | 4571 (F) | $5.161 \times 10^{15}$ (F) |

CONCLUSION

The invention provides an InP seed crystal surface treatment device and a process method. The device combines corrosion, cleaning and drying processes of seed crystals, can completely remove impurities and contamination on the surfaces of the seed crystals through dynamic process swing, and effectively ensures the cleanliness of the surfaces of the seed crystals before use. The comparison of Hall test results shows that when the seed crystals with the high cleanliness are used for crystal growth, crystals with excellent parameters easily grow.

The invention claimed is:

1. A rocking type seed crystal surface corrosion, cleaning and drying device, comprising a corrosion tank (1) and a matched corrosion tank cover (2), a seed crystal support platform arranged at a middle position of the bottom of the corrosion tank (1), and a high-purity hot nitrogen introduction straight pipe (1-1), an corrosive liquid introduction straight pipe (1-2), a deionized water introduction straight pipe (1-3) and an overflow liquid discharge straight pipe (1-4) matched with and arranged at both sides of the corrosion tank (1), wherein free ends of the high-purity hot nitrogen introduction straight pipe (1-1), the corrosive liquid introduction straight pipe (1-2) and the deionized water introduction straight pipe (1-3) are all provided with switch stop valves, characterized in that the device further comprises a rocking mechanism provided at the bottom of the corrosion tank (1); and the seed crystal support platform comprises a support frame (3-1) symmetrically distributed on both sides of a vertical central axis of the corrosion tank (1) and positioned at the bottom of the corrosion tank (1), a seed crystal support wheel (3-2) mounted on an upper end of the support frame (3-1) via a rotating shaft, and a matched seed crystal support wheel limiting mechanism.

2. The rocking type seed crystal surface corrosion, cleaning and drying device according to claim 1, characterized in that an annular groove (3-2-1) is provided on the seed crystal support wheel (3-2), and the cross section of the annular groove (3-2-1) is in the shape of an isosceles trapezoid.

3. The rocking type seed crystal surface corrosion, cleaning and drying device according to claim 1, characterized in that the seed crystal support wheel limiting mechanism comprises a limiting rod (3-3) arranged at one side of the seed crystal support wheel (3-2) and a limiting plate (3-4) symmetrically arranged at both sides of the support frame (3-1);

and a limiting angle of the seed crystal support wheel limiting mechanism is formed by rotating leftward and rightward for 45-60° based on a vertical axis of the support frame (3-1).

4. The rocking type seed crystal surface corrosion, cleaning and drying device according to claim 1, characterized in that the rocking mechanism comprises a base (4-1), a rocking rotating shaft (4-3) provided on the base (4-1) via a support rod (4-2), a rocking platform (4-4) hinged on the rocking rotating shaft (4-3), and a matched rocking driving mechanism; wherein an upper end face of the rocking platform (4-4) is connected to a bottom face of the corrosion tank (1).

5. The rocking type seed crystal surface corrosion, cleaning and drying device according to claim 4, characterized in that the rocking driving mechanism comprises a rocking motor provided on the base (4-1), a rocking runner (4-5) provided at an output end of the rocking motor, and a rocking rod (4-6) hinged to a lower end face of the rocking runner (4-5) and the rocking platform (4-4).

6. The rocking type seed crystal surface corrosion, cleaning and drying device according to claim 4, characterized in that the rocking mechanism further comprises a surrounding plate (4-7) arranged around the base (4-1), and a telescopic protective curtain (4-8) connected to an upper end face of the surrounding plate (4-7) and a lower end face of the rocking platform (4-4), wherein the material of the telescopic protective curtain (4-8) is silica gel or fluorelastomer.

7. The rocking type seed crystal surface corrosion, cleaning and drying device according to claim 1, characterized in that the high-purity hot nitrogen gas introduction straight pipe (1-1) and the deionized water introduction straight pipe (1-3) are distributed in an up-and-down position and are mounted on one side of the corrosion tank (1); the overflow liquid discharge straight pipe (1-4) and the corrosive liquid introduction straight pipe (1-2) are distributed in an up-and-down position and are mounted on the other side of the corrosion tank (1); the high-purity hot nitrogen gas introduction straight pipe (1-1) is tilted upwards, and has an included angle of 30-40° with a wall of the corrosion tank (1); the deionized water introduction straight pipe (1-3) and the corrosive liquid introduction straight pipe (1-2) are tilted upwards, and has an included angle of 50-60° with the wall of the corrosion tank (1); and the overflow liquid discharge straight pipe (1-4) is tilted downwards, and has an included angle of 50-60° with the wall of the corrosion tank (1).

8. The rocking type seed crystal surface corrosion, cleaning and drying device according to claim 1, characterized in that a drain pipe and a matched switch stop valve are provided at the bottom of the corrosion tank (1), and an inner wall of the corrosion tank (1) is provided with a level scale of the inflow corrosive liquid.

9. The rocking type seed crystal surface corrosion, cleaning and drying device according to claim 1, characterized in that an anti-collision buffer pad (3-5) is mounted inside the corrosion tank (1) on both sides and at the same horizontal position as the seed crystal support wheel (3-2).

* * * * *